United States Patent
Jien et al.

(10) Patent No.: US 9,865,347 B2
(45) Date of Patent: Jan. 9, 2018

(54) MEMORY DRIVING CIRCUIT

(71) Applicants: Jiangsu Advanced Memory Technology Co., Ltd., Jiangsu (CN); ALTO MEMORY TECHNOLOGY CORPORATION, Hsinchu County (TW)

(72) Inventors: Fan-Yi Jien, Hsinchu County (TW); Jia-Hwang Chang, Hsinchu County (TW); Sheng-Tsai Huang, Hsinchu County (TW); Jui-Jen Wu, Hsinchu County (TW)

(73) Assignees: Jiangsu Advanced Memory Technology Co., Ltd., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/098,316

(22) Filed: Apr. 14, 2016

(65) Prior Publication Data
US 2017/0076796 A1 Mar. 16, 2017

(30) Foreign Application Priority Data
Sep. 16, 2015 (CN) .......................... 2015 1 0590023

(51) Int. Cl.
*G11C 13/00* (2006.01)
*G11C 5/14* (2006.01)
(Continued)

(52) U.S. Cl.
CPC .......... *G11C 13/0069* (2013.01); *G11C 5/147* (2013.01); *G11C 11/1655* (2013.01);
(Continued)

(58) Field of Classification Search
CPC ........................... G11C 13/0069; G11C 5/147
(Continued)

(56) References Cited

U.S. PATENT DOCUMENTS

| 4,316,185 A | 2/1982 | Watrous et al. |
| 7,009,443 B2 * | 3/2006 | Illegems ................ G11C 17/18 327/525 |

(Continued)

FOREIGN PATENT DOCUMENTS

| CN | 102955492 A | 3/2013 |
| CN | 104240746 A | 12/2014 |
| CN | 104821179 A | 8/2015 |

*Primary Examiner* — Huan Hoang
*Assistant Examiner* — Muna A Techane
(74) *Attorney, Agent, or Firm* — CKC & Partners Co., Ltd.

(57) ABSTRACT

A memory driving circuit is disclosed herein. The memory driving circuit includes a programmable current source, a reference voltage generation unit and a voltage comparator unit. The programmable current source generates a second current according to a first current. The second current flows into a memory cell, and produces a device voltage at the input of the memory cell. The reference voltage generation unit generates a crystal voltage. The voltage comparator unit compares the device voltage with the crystal voltage and sends out a control signal to control the programmable current source. The first current and the second current are adjusted by the control signal so that the shape of the current pulse of SET operation to the memory cell is well controlled.

10 Claims, 7 Drawing Sheets

(51) Int. Cl.
*G11C 11/16* (2006.01)
*G11C 29/02* (2006.01)
(52) U.S. Cl.
CPC ...... *G11C 11/1657* (2013.01); *G11C 11/1673* (2013.01); *G11C 11/1675* (2013.01); *G11C 13/0026* (2013.01); *G11C 13/0028* (2013.01); *G11C 29/021* (2013.01); *G11C 29/028* (2013.01); *G11C 2013/0078* (2013.01)
(58) Field of Classification Search
USPC .................................................. 365/189.02
See application file for complete search history.

(56) References Cited

U.S. PATENT DOCUMENTS

| | | | |
|---|---|---|---|
| 7,501,879 B1 * | 3/2009 | Oh .......................... | G11C 17/16 327/525 |
| 7,983,888 B2 | 7/2011 | Evoy et al. | |
| 8,873,322 B2 | 10/2014 | Ahn et al. | |
| 2003/0048684 A1 * | 3/2003 | Tanzawa ................. | G11C 5/147 365/226 |
| 2010/0103723 A1 * | 4/2010 | Kawai ..................... | G11C 11/56 365/163 |
| 2015/0200363 A1 * | 7/2015 | Sacchetto .......... | G11C 13/0007 365/148 |
| 2015/0227738 A1 * | 8/2015 | Katoh ..................... | G09C 1/00 713/168 |

* cited by examiner

MEMORY DRIVING CIRCUIT

RELATED APPLICATIONS

This application claims priority to Chinese Application Serial Number 201510590023.7, filed Sep. 16 2015, which is herein incorporated by reference.

BACKGROUND

Technical Field

The present disclosure relates to a memory driving circuit, and in particular, to a driving circuit configured to write a memristor memory.

Description of Related Art

The development of current memory technologies such as Dynamic Random Access Memory (DRAM) and Static Random Access Memory (SRAM) is gradually maturing and facing physical limits for scaling. Therefore, developing new memory technologies for future memory applications is an important area of research in the related field. In this regard, the memristor memory includes phase change memory (PCM), resistive memory (ReRAM or RRAM) and Magnetoresistive memory (MRAM), and while these different types of memristor memories use different physics mechanisms to store data they are all configured to read "1" or "0" by distinguishing the resistance value of the memory element. Phase change memory may be configured to change the resistance value of the element by varying the crystallization of its material, in order to store data by the change of the resistance value. When the material of the memory element is in crystalline state, a low resistance value is shown; on the other hand, when the material of the memory element is in an amorphous state, a high resistance value is shown.

However, memristor memories need a corresponding driving current to execute the SET or RESET operation. Therefore, the design of a driving circuit for memristor memories has become an important area of research in recent times, and is an area requiring improvement.

SUMMARY

One aspect of the present disclosure is a memory driving circuit. The memory driving circuit includes a programmable current source, a reference voltage generation unit, and a voltage comparator unit The programmable current source is configured to generate a first current and a second current, wherein the second current drives a memory cell and produces a device voltage at a current input terminal of the memory cell, and the second current is proportional to the first current. The reference voltage generation unit includes a reference voltage terminal configured to output a crystal voltage. The voltage comparator unit includes a first voltage input terminal, a second voltage input terminal, and a comparison output terminal. The reference voltage terminal is electrically coupled to the first voltage input terminal, the current input terminal of the memory cell is electrically coupled to the second voltage input terminal, and the comparison output terminal is electrically coupled to the programmable current source. The voltage comparator unit compares the device voltage with the crystal voltage and sends out a first control signal to control the programmable current source in order to adjust the magnitude of the first current and the second current.

It is to be understood that both the foregoing general description and the following detailed description are by examples and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1:
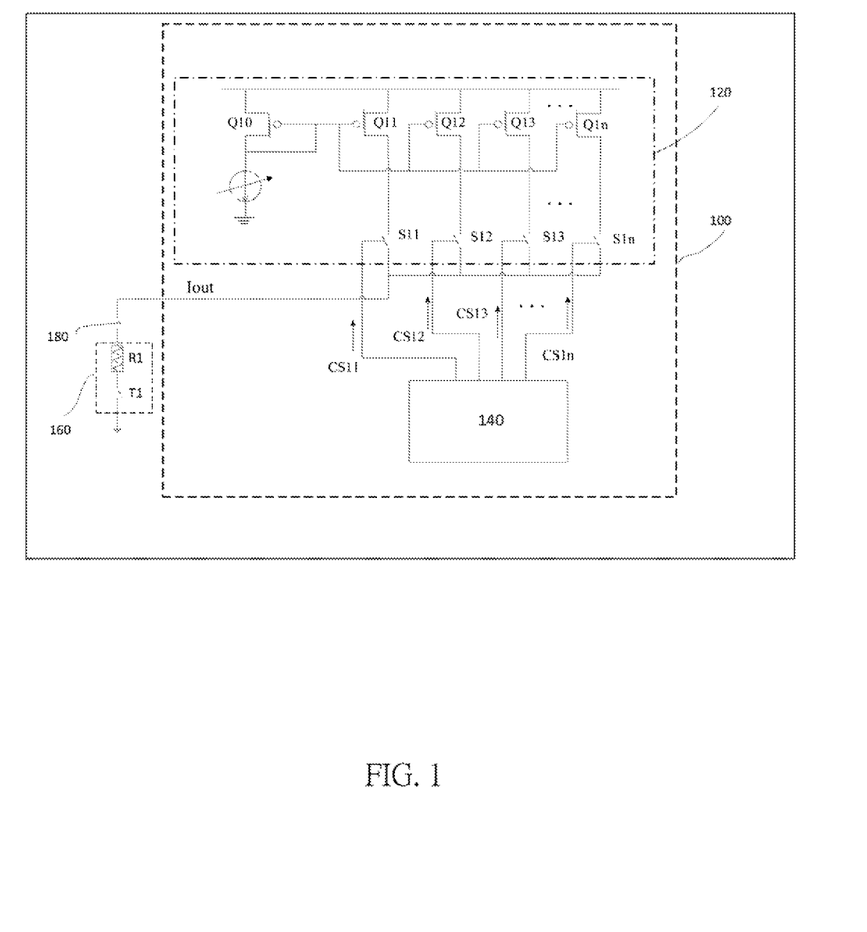
FIG. 1 is a schematic diagram illustrating a known memristor memory driving circuit.

Reference is made to FIG. 1. FIG. 1 is a schematic diagram illustrating a known memristor memory driving circuit 100. A Phase Change Memory (PCM) is taken as an example. As shown in FIG. 1, the memristor memory driving circuit 100 is configured to provide a driving current Iout to a memory cell 160. The memory cell 160 includes a programmable resistor R1 and a transistor T1, which form a basic one-transistor one-resistor (1T1R) structure. In some embodiments the memory cell 160 may include one resistor R1 and one diode (1D1R), or one resistor R1 and multiple transistors or diodes connected in parallel (xT1R or xD1R). By executing RESET or SET operation, the external driving current Iout is able to change the resistance of the resistor R1 so that the memory cell 160 can store information according to a high resistance state or a is resistance state of the resistor R1.

In the case of a Phase Change Memory (PCM) the material of the memory cell 160 may be in a crystalline or amorphous state according to the change in temperature. Due to the fact that the conductivity characteristics of the memory cell 160 are different in the crystalline state and the amorphous state, information may be stored in the memory cell 160 by changing the crystal form via an appropriate driving current. When executing SET and RESET operations, in order to control the crystal form, the amplitude of the driving current needs to be controlled appropriately. Specific details in this regard will be described, together with the drawings, in the following paragraphs.

The memory driving circuit 100 includes a plurality of current mirror circuits 120 and a control unit 140. The current mirror circuits 120 include a transistor Q10, transistors Q11~Q1n and switches S11~S1n. The switches S11~S1n are selectively turned on or turned off, according to the respective control signals CS11~CS1n of the control unit 140, to adjust the numbers of connected current mirror circuits 120 so as to control the amplitude of the driving current Iout.

Figure 2:
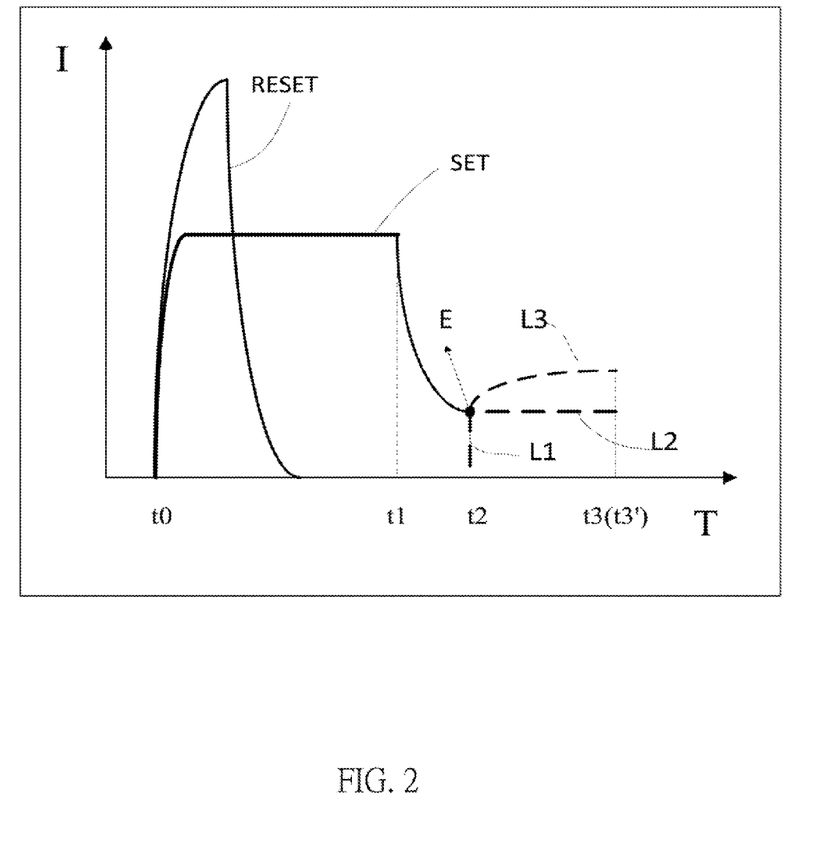
FIG. 2 is a diagram illustrating the current pulse of the memristor memory in RESET or SET operations.

Reference is made to FIG. 2. In the case of the Phase Change Memory (PCM), there are two writing operations for the memory cell 160: one is the RESET operation and the other is the SET operation. During the RESET change material R1 is heated to be in a molten state. Then, the current falls abruptly and the phase change material R cools down rapidly as well, so that the phase change material R1 is in amorphous state, which is of high resistance state ($R_H$). During the SET operation, in order to appropriately control the crystal form of the material, the memory driving circuit 100 is configured to correspondingly control the driving current Iout in a fast transition stage and a slow transition stage. First, during the fast transition stage, between time t0 and t1, switches S11~S1n are all turned ON such that every current mirror circuit 120 is enabled. Thus, the memory driving circuit 100 is configured to output a maximum current. Next, between time t1 and t2, the memory driving circuit 100 is shifted into the slow transition stage. During this stage, in order to control the driving current Iout to decrease gradually, the control unit 140, via the control signals CS11~CS1n, correspondingly turns OFF the switches S11~S1n one by one so that the number of the conducting current mirror circuits 120 decreases gradually. Thus, during the slow transition stage, the memory driving circuit 100 may be configured to step-wisely reduce the output driving current Iout.

Time t2 is the end point (point E) of the SET current pulse, and at the time t2, the current pattern after time t2 is determined according to the needed resistance value of the phase change material R in crystalline state. According to the physical theory, when the current flows through the phase change material R1, it is heated; and continuously being heated at the temperature under the crystallization temperature (Tx), the phase change material R1 can be crystallized further so as to obtain lower resistance. Thus, there are at least three types of current pattern, L1, L2 and L3 as shown in the FIG. 2, after the time t2. The current pattern L1 indicates that the SET current reduces to zero immediately at time t2 and stops heating the phase change material R1. The current pattern L2 indicates that the SET current maintains the current at the same value of point E for a period until time l3. Alternatively stated, the phase change material is continuously heated at the low temperature for the period of time. The current pattern L3 indicates that the SET current gradually and slowly rises to a saturation state (the saturated value is not shown) and continues for a period to time t3'. It is noted that the time t3 and the time t3' mentioned above may be different and are controllable. The time point t3 and t3' can be controlled by circuits, such as counters and resistor-capacitor RC circuits, so that the writing current can be maintained for a preset fixed time before being cut off. It is noted that, the aforementioned crystallization temperature (Tx) means that, at the temperature, materials will exhibit the highest crystallization rate.

The choice of the current patterns L1, L2 or L3 after the point E depends on whether the resistance value of the phase change material RI at the point E reaches a required low resistance value ($R_L$). If the resistance value of the phase change material R1 has reached the required low resistance value ($R_L$), the SET current can be cut off immediately (as the current pattern L1). Nevertheless, the current pattern L2 and L3 may also be applied to further lower the resistance value of the phase change material to guarantee that the final resistance value of the phase change material R1 of each memory cells in the entire chip is lower than the regulated low resistance ($R_L$) state.

Figure 3:
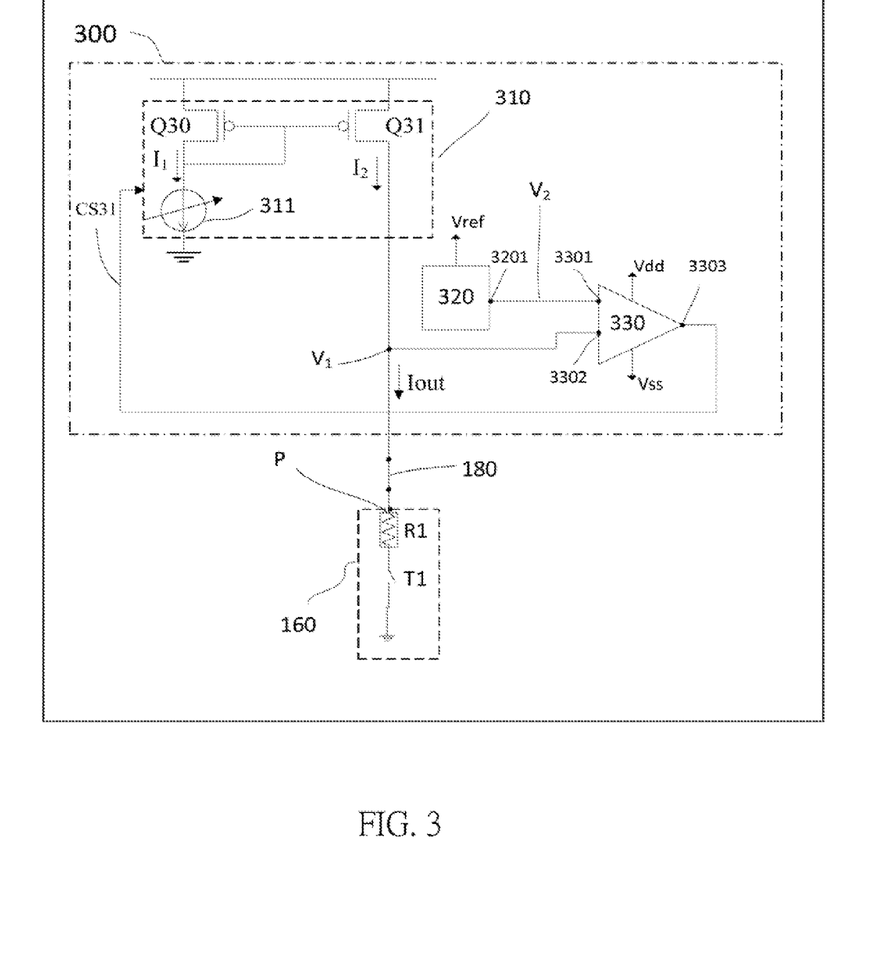
FIG. 3 is a schematic diagram illustrating a memory driving circuit according to an embodiment of the present disclosure.

To solve the problems stated above, a memory driving circuit is disclosed in the present disclosure to determine the end point E of the pulse of the SET current and the way of applying the aforementioned current patterns L1, L2 or L3. Reference is made to FIG. 3, FIG. 3 is a schematic diagram illustrating a memory driving circuit 300 according to an embodiment of the present disclosure. In the present embodiment, the memory driving circuit 300 and at least one memory cell 160 are included. Each memory cell 160 includes a resistor R1 and a transistor T1, which forms a basic one-transistor one-resistor (1T1R) structure. The memory cell 160 is able to change the resistance of the resistor R1 by an external driving current Iout in order to execute SET and RESET operations. In the present example, the memory cell 160 may include a phase change memory (PCM), a resistive memory (ReRAM or RRAM) or a Magnetoresistive memory (MRAM).

When executing the SET or RESET operations on the memory cell 160, a word line in the memory enables the transistor T1 in the memory cell 160, and the switching unit 180 is correspondingly turned ON to provide the current path of the driving current Iout. Thus, in the memory array formed by a plurality of memory cells 160, by controlling the switches on the corresponding word lines and bit lines, the target memory cell may be configured to execute corresponding operations.

Reference is made to FIG. 3 again. The memory driving circuit 300 includes a programmable current source 310, a reference voltage generation unit 320, and a voltage comparator unit 330. The reference voltage generation unit 320 includes a reference voltage terminal 3201. The voltage comparator unit 330 includes a first voltage input terminal 3301, a second voltage input terminal 3302, and a comparison output terminal 3303. The reference voltage terminal 3201 is electrically coupled to the first voltage input terminal 3301, the current input terminal P of the memory cell is electrically coupled to the second voltage input terminal 3302, and the comparison output terminal 3303 outputs a first control signal CS31 to control the programmable current source 310.

The programmable current source 310 is, in a proportional relationship, configured to generate a second current I2 according to a first current I1. The second current I2, which is also the driving current Iout, provides current to the memory cell 160 and generates a device voltage V1 at the current input terminal P of the memory cell. The reference voltage generation unit 320 generates the crystal voltage V2. The voltage comparator unit 330 compares the device voltage V1 with the crystal voltage V2 and sends out the first control signal CS31 to the programmable current source 310 in order to adjust the magnitude of the first current I1. Since the second current I2 is proportional to the first current I1, the first control signal CS31 indirectly controls the magnitude of the second current I2. The proportional relationship between I1 and I2 is designed by manipulating the channel widths of the transistors Q30 and Q31, so that the magnitude of the second current I2 is N times or 1/N times of the magnitude of the first current I1, wherein N is an integer. The detailed design theory is common knowledge of the semiconductor and electronics circuit and thus is omitted herein for the sake of the brevity. Generally, if the value of the first current I1 is too small, the second current I2 may be designed to be N times of the first current I1, in order to amplify the current for the convenience of latter operations. But, in the special case, the second current I2 may be designed to be 1/N times of the first current I1 to lower the current for the convenience of latter specific applications.

The reference voltage generation unit 320 provides the crystal voltage V2 to determine whether the resistance of the phase change material reaches the low resistance value $R_L$. The second current I2 (Iout) generated by the programmable current source 310 is provided to the memory cell 160, and gives rise to the device voltage V1 at the current input terminal P of the memory cell, wherein V1=Iout×R1. Reference is made in accordance with FIG. 2. When the resistance of the phase change material R1 does not reach the low resistance value $R_L$, the device voltage V1 is larger than the crystal voltage V2 (V1−V2>0), and the voltage comparator unit 330 sends out the first control signal CS31 (i.e., a high-level signal "H") such that the programmable current source 310 keeps supplying current, as original planned, in the slow transition stage mode (between time t1 and t2).

On the other hand, if the resistance of the phase change material R1 is lower than the low resistance value $R_L$, the device voltage V1 will be equal to or smaller than the crystal voltage V2 (V1−V2≤0). At the end point E of the pulse of the SET current, that is at time t2, the voltage comparator unit 330 sends out the first control signal CS31 (i.e., a low-level signal "L") to the programmable current source 310. Consequently, the programmable current source 310 immediately stops supplying current, and the SET current shifts to the current pattern L1 to stop heating the phase change material R1. In another embodiment, the programmable current source 310 maintains the fixed supply current. The SET current is changed to the current pattern L2 to continuously heat the phase change material for a period until time t3 to further guarantee the resistance value of the phase change material R1 of each memory cell 160 in the storage array is lower than the regulated low resistance state $R_L$. In one another embodiment, the programmable current source 310 gradually raises the current supply to a saturation state. In that situation, the SET current is set to the current pattern L3 to continuously heating the phase change material for a period until time t3' to further guarantee the low resistance state of the phase change material R1 is lower than the regulated low resistance state $R_L$.

The voltage comparator unit 330 compares the device voltage V1 with the crystal Voltage V2 and outputs the first control signal CS31. It is noted that the aforementioned high/low behavior of the first control signal CS31 is only an example. In another embodiment the high/low behavior of the first control signal CS31 can be opposite. That is, when the device voltage V1 is larger than the crystal voltage V2 (V1−V2>0), the first control signal CS31 is in low-level "L", and when the device voltage V1 is smaller than the crystal voltage V2 (V1−V2≤0 ), the first control signal CS31 is in high-level "H."

In order to increase the accuracy of a circuit itself or prevent the misoperation due to the noises, in one embodiment, when the device voltage V1 comes close or equals to the crystal voltage V2, a guard band voltage (Vgb) may be designed in the circuit. In that case, the voltage comparator unit 330 sends out the first control signal CS31 with low level "L" when the device voltage V1 and the crystal voltage V2 meets the condition: V1−V2≤Vgb. Alternatively stated, the voltage comparator unit 330 changes the control signal only when the device voltage V1 is not only smaller than the crystal voltage V2, but the difference of them is larger than the guard band voltage.

Figure 4:
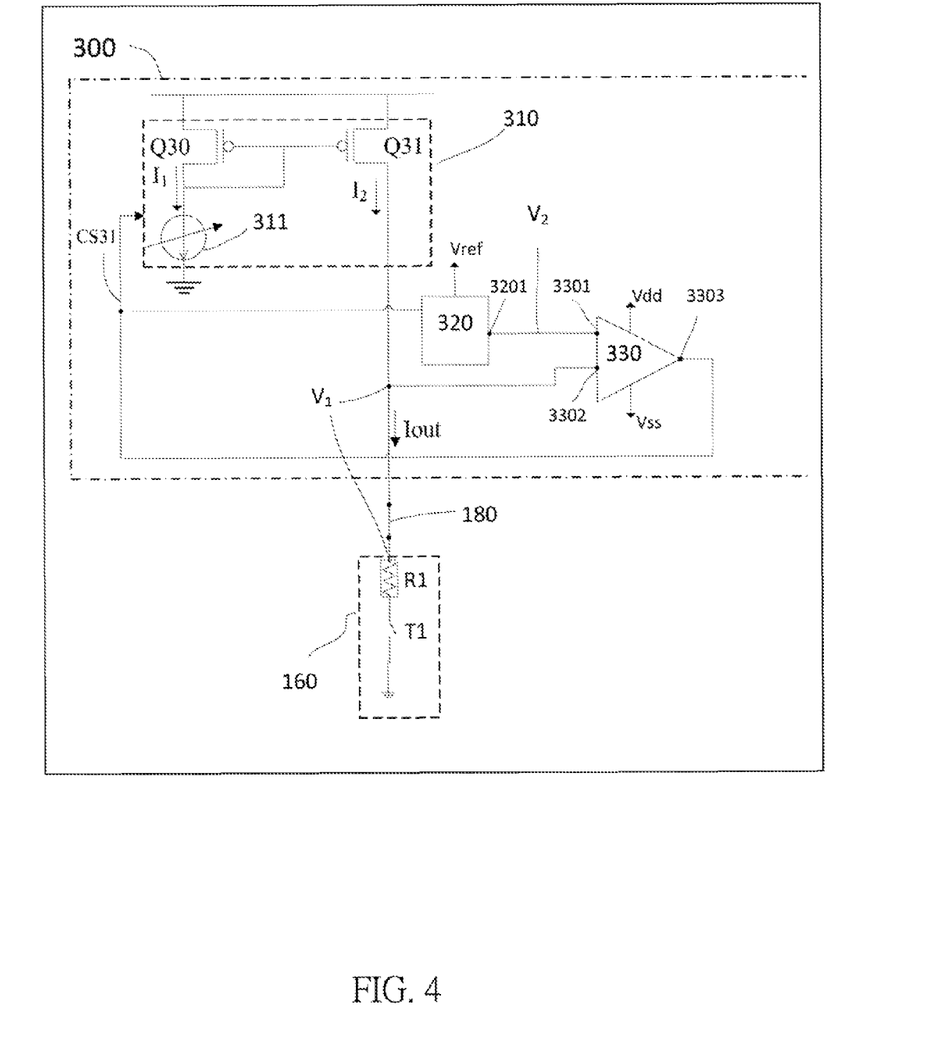
FIG. 4 is a schematic diagram illustrating a memory driving circuit according to an embodiment of the present disclosure.
Figure 5:
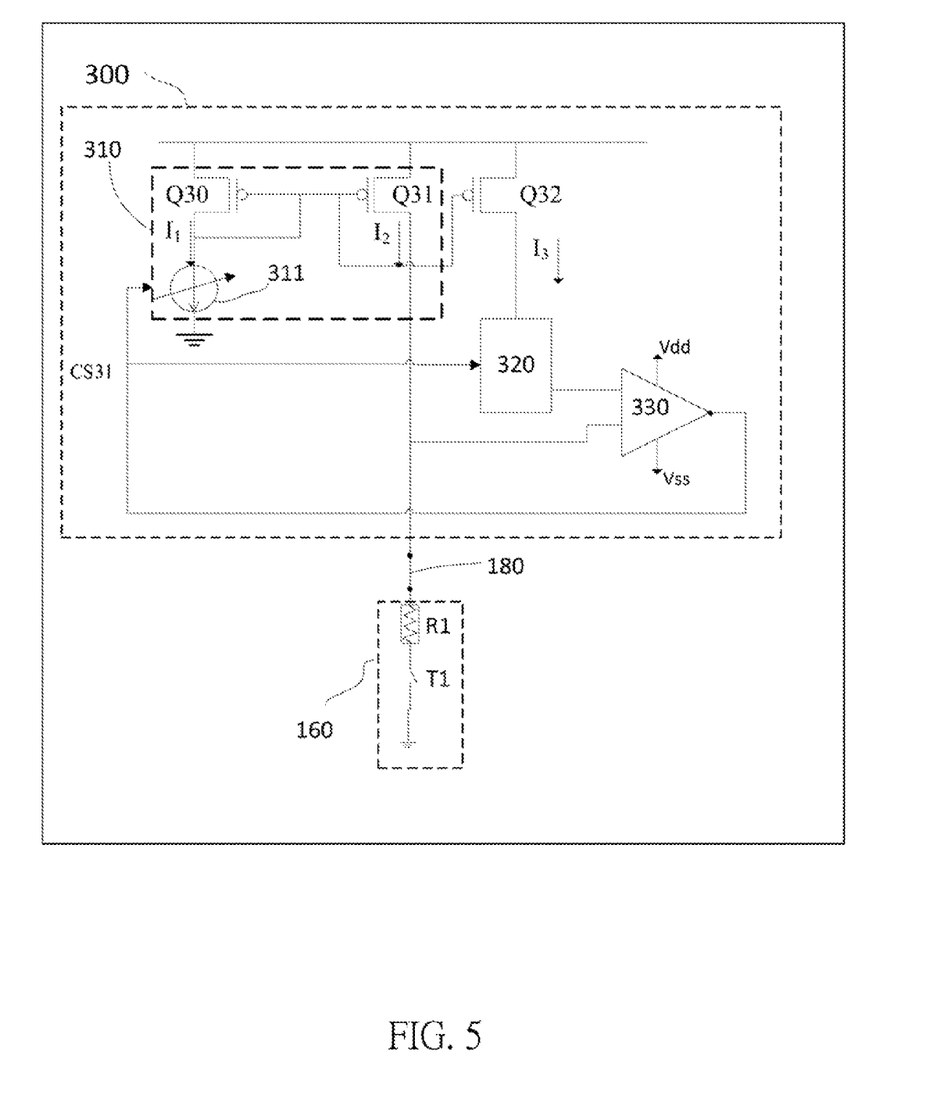
FIG. 5 is a schematic diagram illustrating a memory driving circuit according to an embodiment of the present disclosure.

Another embodiment of the present, disclosure shown in FIG. 4. Compared to FIG. 3, the comparison output terminal 3303 of the voltage comparator unit 330 in FIG. 4 is also electrically coupled to the reference voltage generation unit 320. Thus the first control signal CS31 may also control the reference voltage generation unit 320 to change the value of the outputted crystal voltage V2. When the value of the crystal voltage V2 is able to be adjusted dynamically various advantages may be achieved, including instantly configuring the lower specification of low resistance state $R_L$.

In the embodiments shown in FIG. 3 and FIG. 4, the power supply of the voltage comparator unit 330 is a constant voltage source Vref. In one embodiment, the power supply of the voltage comparator unit 330 is a constant current source 13, which is a current mirror current source formed by the transistor Q32 and Q30, but the present disclosure is not limited thereto.

Figure 6:
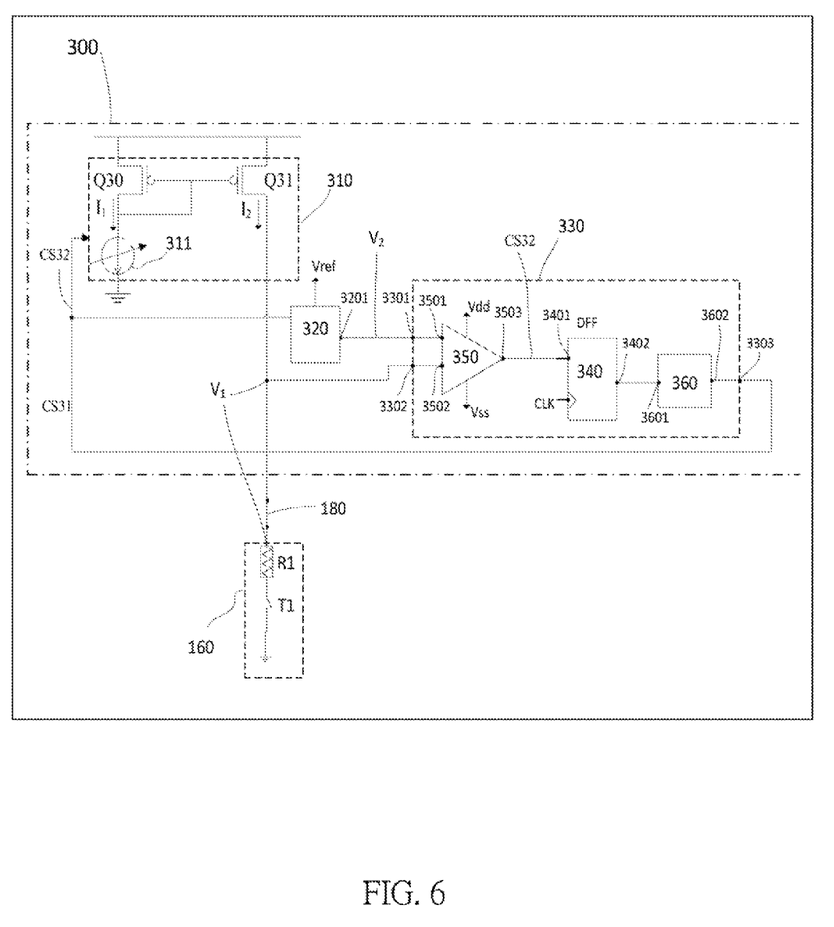
FIG. 6 is a schematic diagram illustrating a memory driving circuit according to an embodiment of the present disclosure.

FIG. 6 is another embodiment of the present disclosure. In the present embodiment, the voltage comparator unit 330 further includes an operational amplifier 350, a d-type flip flop unit 340, and a logic circuit unit 360. The first terminal 3501 of the operational amplifier 350 is connected to the first voltage input terminal 3301 the second terminal 3502 of the operational amplifier 350 is connected to the second voltage input terminal 3302, and the amplifier output terminal 3503 of the operational amplifier 350 is electrically connected to the data input terminal 3401 of the d-type flip flop unit 340. The data output terminal 3402 of the d-type flip flop unit 340 is electrically connected to the logic input terminal 3601 of the logic circuit unit 360, and the clock input terminal CLK of the d-type flip flop unit 340 is configured to receive the clock, and the logic output terminal 3602 of the logic circuit unit 360 is electrically connected to the comparison output terminal 3303.

Reference is made to FIG. 6 again. In the present embodiment, the d-type flip flop unit 340 may sample, at each clock cycle, the second control signal CS32, which is outputted by the amplifier output terminal 3503 of the operational amplifier 350; and then converts the sampled value to a logic value (L or H) and send to the logic circuit unit 360. By the operation of the logic circuit unit 360, the first control signal CS31 is generated to control the programmable current source 310 alone, or control both the programmable current source 310 and the reference voltage generation unit 320 at the same time. The advantage is that the second control, signal CS32 is sampled multiple times so that the value of the low resistance state $R_L$ of the phase change material R1 can be more correctly determined. In one embodiment, the d-type flip flop unit 340 includes a plurality of d-type flip flops connected in series (not shown) and driven by the same clock; and thus the logic circuit unit 360 can operate multiple bit data to output the first control signal CS31.

Figure 7A:
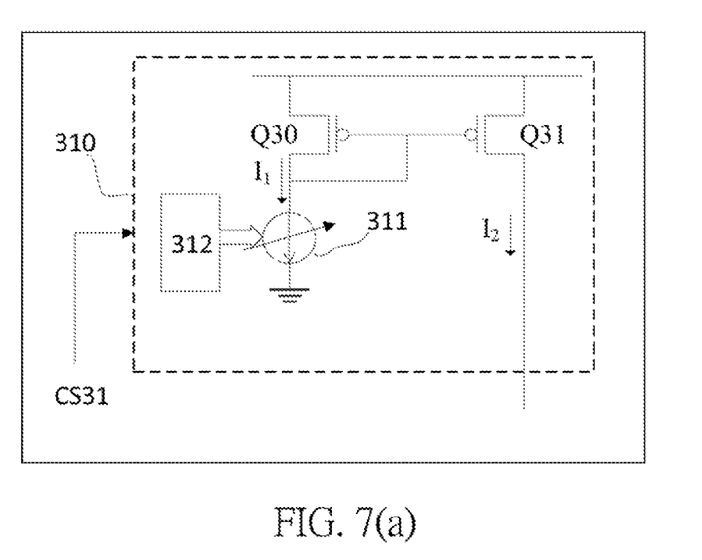
FIG. 7(a) is an internal circuit diagram illustrating a programmable current source according to an embodiment of the present disclosure.
Figure 7B:
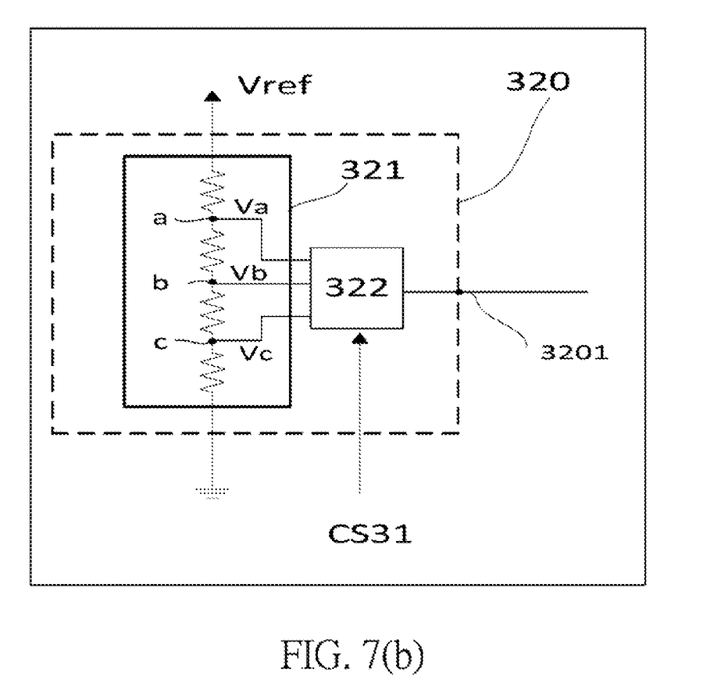
FIG. 7(b) is an internal circuit diagram illustrating a reference voltage generation unit according to an embodiment of the present disclosure.

Reference is made to FIG. 7(a) and FIG. 7(b). An embodiment of the programmable current source 310 is shown in FIG. 7(a), in which a register 312 is included. The register can store multiple bit data of the first control signal CS31, and control the programmable reference current unit 311 to configure the first current I1 with various values so as to control the value of the second current I2.

An embodiment of the reference voltage generation unit 320 is shown in FIG. 7(b), in which a register and multiplexer 322 and a resistive voltage divider 321. The resistive voltage divider 321 includes multiple resistors which are connected in series. The register and multiplexer 322 store multiple bit data of the first control signal CS31, and determine to output the voltage, via the node a, b, or c of the resistance voltage divider 321, to the reference voltage terminal 3201. The numbers of the resistors connected in series are not limited to 3 as illustratively shown in FIG. 7(b). In one embodiment, the numbers of the resistors connected in series in the resistive voltage divider 321 may be larger or smaller than 3 to divide voltage more precisely or roughly.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure, in view of the foregoing, it is intended that the present disclosure cover modifications and variations of this disclosure provided they fall within the scope of the following claims.

What is claimed is:

1. A memory driving circuit, comprising:
    a programmable current source, configured to generate a first current and a second current, wherein the second current drives a memory cell and produces a device voltage at a current input terminal of the memory cell, wherein the second current is proportional to the first current;
    a reference voltage generation unit comprising a reference voltage terminal and configured to output a crystal voltage; and
    a voltage comparator unit, comprising a first voltage input terminal, a second voltage input terminal, and a comparison output terminal, wherein the reference voltage terminal is connected to the first voltage input terminal, the current input terminal of the memory cell is connected to the second voltage input terminal, and the comparison output terminal is directly connected to the programmable current source;
    wherein the voltage comparator unit compares the device voltage with the crystal voltage and sends out a first control signal, via the comparison output terminal, to control the programmable current source in order to adjust the magnitude of the first current and the second current.

2. The memory driving circuit of claim 1, wherein the comparison output terminal is directly connected to the reference voltage generation unit so that the first control signal controls the reference voltage generation unit to adjust the magnitude of the crystal voltage.

3. The memory driving circuit of claim 1, wherein the voltage comparator unit comprises:
    an operational amplifier comprising a first terminal, a second terminal, and an amplifier output terminal, wherein the first terminal is connected to the first voltage input terminal, and the second terminal is connected to the second voltage input terminal;
    a d-type flip flop unit comprising a data input terminal, a data output terminal, and a clock input terminal, wherein the amplifier output terminal is electrically connected to the data input terminal, and the operational amplifier compares the crystal voltage with the device voltage, and, via the amplifier output terminal, outputs a second control signal to the data input terminal, wherein the d-type flip flop unit samples, at each clock cycle, the voltage level of the second control signal, converts the voltage level and outputs a logic value to the data output terminal; and
    a logic circuit unit comprising a logic input terminal and a logic output terminal, wherein the data output terminal is electrically connected to the logic input terminal, the logic output terminal is electrically connected to the comparison output terminal, and the logic circuit unit operates the logic value and sends out the first control signal to the comparison output terminal.

4. The memory driving circuit of claim 3, wherein the comparison output terminal is directly connected to the reference voltage generation unit so that the first control signal controls the reference voltage generation unit to adjust the magnitude of the crystal voltage.

5. The memory driving circuit of claim 4, wherein the reference voltage generation unit comprises a register and a multiplexer, configured to store the first control signal obtained in the clock cycle and adjust the value of the crystal voltage.

6. The memory driving circuit of claim 3, wherein the d-type flip flop unit comprises a plurality of d-type flip flops connected in series and sharing a same clock.

7. The memory driving circuit of claim 3, wherein the programmable current source comprises a register and a programmable reference current unit, wherein the register stores the first control signal obtained in the clock cycle and configures the current magnitude of the programmable reference current unit to generate the first current.

8. The memory driving circuit of claim 1, wherein the second current being proportional to the first current indicates the magnitude of the second current is N times or 1/N times of the magnitude of the first current, wherein N is an integer.

9. The memory driving circuit of claim 1, wherein a power source of the reference voltage generation unit is a constant voltage source.

10. The memory driving circuit of claim 1, wherein a power source of the reference voltage generation unit is a constant current source.

* * * * *